United States Patent
Das et al.

(10) Patent No.: US 10,128,803 B2
(45) Date of Patent: Nov. 13, 2018

(54) SYSTEMS AND METHODS FOR PREDICTIVE SWITCHING IN AUDIO AMPLIFIERS

(71) Applicant: Cirrus Logic International Semiconductor Ltd., Edinburgh (GB)

(72) Inventors: Tejasvi Das, Austin, TX (US); John L. Melanson, Austin, TX (US); Eric J. King, Dripping Springs, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/136,548

(22) Filed: Apr. 22, 2016

(65) Prior Publication Data

US 2017/0310288 A1    Oct. 26, 2017

(51) Int. Cl.
*H03F 3/183*    (2006.01)
*H03K 5/1536*    (2006.01)
(Continued)

(52) U.S. Cl.
CPC ............ *H03F 3/183* (2013.01); *H03F 1/025* (2013.01); *H03F 1/0222* (2013.01); *H03F 1/305* (2013.01);
(Continued)

(58) Field of Classification Search
CPC .. H03F 3/183; H03F 3/2175; H03F 2200/102; H03F 2200/03; H04R 3/007; H03K 5/1536
See application file for complete search history.

(56) References Cited

U.S. PATENT DOCUMENTS 9,209,757 B1    12/2015 Thandri et al.
2004/0001586 A1*    1/2004 Melsa ................ H04M 19/001
                                                      379/399.01
(Continued)

FOREIGN PATENT DOCUMENTS

EP    0279694 A2    8/1988
EP    2819303 A1    12/2014
GB    2527677 A    12/2015

OTHER PUBLICATIONS

Combined Search and Examination Report under Sections 17 and 18(3), United Kingdom Application No. GB1610245.1, dated Dec. 15, 2016.
International Search Report and Written Opinion of the International Searching Authority, International Application No. PCT/US2017/027733, dated Aug. 21, 2017.

*Primary Examiner* — Ping Lee
(74) *Attorney, Agent, or Firm* — Jackson Walker L.L.P.

(57) ABSTRACT

An audio amplifier circuit for providing an output signal to an audio transducer may include a power amplifier and a control circuit. The power amplifier may include an audio input for receiving an audio input signal, an audio output for generating the output signal based on the audio input signal, and a power supply input for receiving a power supply voltage, wherein the power supply voltage is variable among at least a first supply voltage and a second supply voltage greater than the first supply voltage. The control circuit may be configured to predict, based on one or more characteristics of a signal indicative of the output signal, an occurrence of a condition for changing the power supply voltage, and responsive to predicting the occurrence of the condition, change, at an approximate zero crossing of the signal indicative of the output signal, the power supply voltage.

32 Claims, 7 Drawing Sheets

(51) Int. Cl.
*H04R 3/00* (2006.01)
*H03F 1/02* (2006.01)
*H03F 1/30* (2006.01)
*H03F 3/187* (2006.01)
*H03F 3/217* (2006.01)

(52) U.S. Cl.
CPC ............ *H03F 3/187* (2013.01); *H03F 3/2175* (2013.01); *H03K 5/1536* (2013.01); *H04R 3/007* (2013.01); *H03F 2200/03* (2013.01); *H03F 2200/102* (2013.01); *H03F 2200/228* (2013.01); *H03F 2200/321* (2013.01); *H03F 2200/471* (2013.01); *H03F 2200/48* (2013.01); *H03F 2200/504* (2013.01); *H03F 2200/511* (2013.01); *H03F 2200/78* (2013.01)

(56) References Cited

U.S. PATENT DOCUMENTS

| | | | |
|---|---|---|---|
| 2009/0220110 A1* | 9/2009 | Bazarjani | H03F 1/0211 381/120 |
| 2010/0141345 A1 | 6/2010 | Nabicht | |
| 2011/0254625 A1* | 10/2011 | Kohut | H03F 1/0222 330/251 |
| 2012/0133411 A1* | 5/2012 | Miao | H03G 3/001 327/306 |
| 2015/0043753 A1 | 2/2015 | Gu et al. | |
| 2015/0295584 A1 | 10/2015 | Das et al. | |
| 2015/0381130 A1 | 12/2015 | Das et al. | |

\* cited by examiner

SYSTEMS AND METHODS FOR PREDICTIVE SWITCHING IN AUDIO AMPLIFIERS

FIELD OF DISCLOSURE

The present disclosure relates in general to circuits for audio devices, including without limitation personal audio devices, such as wireless telephones and media players, and more specifically, to systems and methods for predictively switching between supply voltages of an audio amplifier in an audio device.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude. Although many amplifier architectures (e.g., Class A, Class B, and Class AB amplifiers) provide for only a single power supply for a power amplifier, some architectures provide for at least two supply voltages for powering a power amplifier, in order to achieve greater power efficiency over single or constant power supply voltage architectures.

One example of a multi-supply voltage amplifier is a Class G amplifier. A Class G amplifier may provide two or more power rails at different voltages and switch between them as the signal output approaches each level. Thus, a Class G amplifier may increase efficiency by reducing the wasted power at output driving transistors of the amplifier. In some instances, a Class G amplifier may be combined with a Class D amplifier to create a Class DG amplifier. A Class DG amplifier may use pulse-width modulation to produce a rail-to-rail digital output signal with a variable duty cycle as a pre-driver signal to an output driver, as is typical with Class D amplifiers. However, as opposed to a Class D amplifier, a Class DG amplifier may use a multi-level output stage which senses a magnitude of the audio output signal and switches between power supplies based on the output magnitude.

Another example of a multi-supply voltage amplifier is a Class H amplifier. A Class H amplifier may be similar to a Class G amplifier, except that instead of selecting among a plurality of voltage rails, a Class H amplifier may have an infinitely variable voltage supply rail. In order to provide such an infinitely variable voltage supply rail, the output supply rail may be modulated such that the rail is only slightly larger than a magnitude of the audio output signal at any given time. For example, switched-mode power supplies may be used to create the output signal-tracking voltage rails.

However, in Class G, Class DG, and Class H amplifiers, when modifying an output voltage, audible audio artifacts (e.g., "pops" and "clicks") may be heard by a listener of an audio device unless measures are taken to reduce or eliminate such audio artifacts.

SUMMARY

In accordance with the teachings of the present disclosure, one or more disadvantages and problems associated with existing approaches to reducing audio artifacts in an audio system having an output stage with a variable supply voltage may be reduced or eliminated.

In accordance with embodiments of the present disclosure, an audio amplifier circuit for providing an output signal to an audio transducer may include a power amplifier and a control circuit. The power amplifier may include an audio input for receiving an audio input signal, an audio output for generating the output signal based on the audio input signal, and a power supply input for receiving a power supply voltage, wherein the power supply voltage is variable among at least a first supply voltage and a second supply voltage greater than the first supply voltage. The control circuit may be configured to predict, based on one or more characteristics of a signal indicative of the output signal, an occurrence of a condition for changing the power supply voltage, and responsive to predicting the occurrence of the condition, change, at an approximate zero crossing of the signal indicative of the output signal, the power supply voltage.

In accordance with these and other embodiments of the present disclosure, a method may be provided for use in an audio amplifier circuit including a power amplifier having an audio input for receiving an audio input signal, an audio output for generating the output signal based on the audio input signal, and a power supply input for receiving a power supply voltage wherein the power supply voltage is variable among at least a first supply voltage and a second supply voltage greater than the first supply voltage. The method may include predicting, based on one or more characteristics of a signal indicative of the output signal, an occurrence of a condition for changing the power supply voltage. The method may also include, responsive to predicting the occurrence of the condition, changing, at an approximate zero crossing of the signal indicative of the output signal, the power supply voltage.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
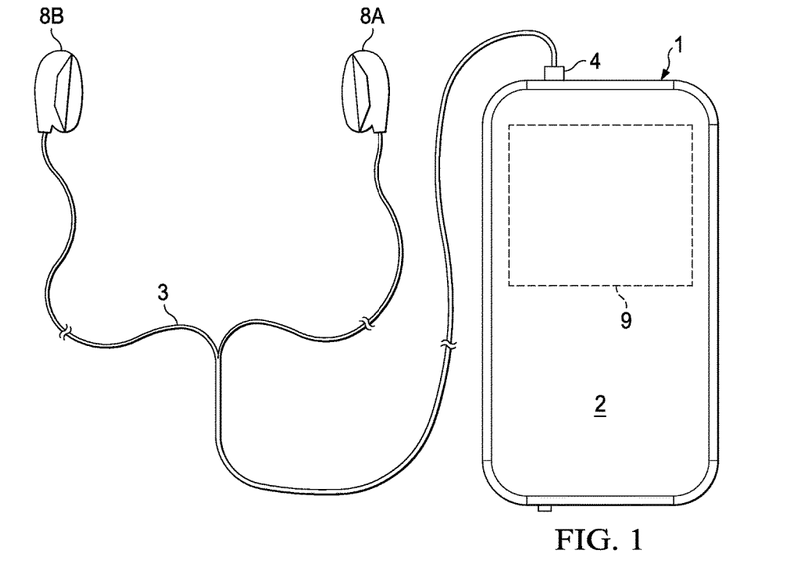
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
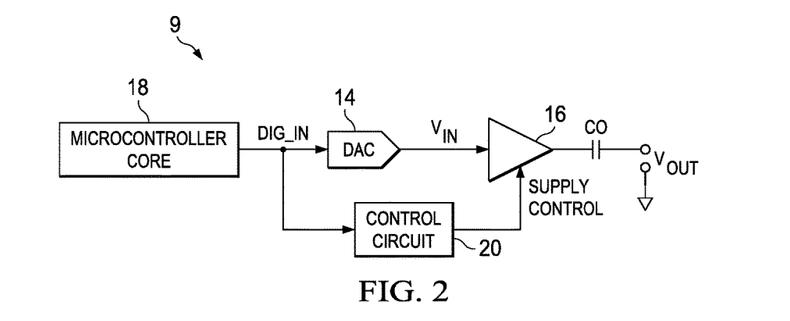
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 may supply a digital audio input signal DIG_IN to a digital-to-analog converter (DAC) 14, which may convert the digital audio input signal to an analog signal $V_{IN}$. DAC 14 may supply analog signal $V_{IN}$ to an amplifier stage 16 which may amplify or attenuate audio input signal $V_{IN}$ to provide an audio output signal $V_{OUT}$, which may operate a speaker, headphone transducer, a line level signal output, and/or other suitable output. A capacitor CO may be utilized to couple the output signal to the transducer or line level output, particularly if amplifier stage 16 is operated from a unipolar power supply having a quiescent voltage substantially differing from ground. Also, as shown in FIG. 2, audio IC 9 may include a control circuit 20 configured to, based on digital audio input signal DIG_IN, control a power supply voltage of amplifier stage 16 using one or more control signals (labeled as "SUPPLY CONTROL" in FIG. 2), as described in greater detail below with respect to FIGS. 3A-7.

Figure 3A:
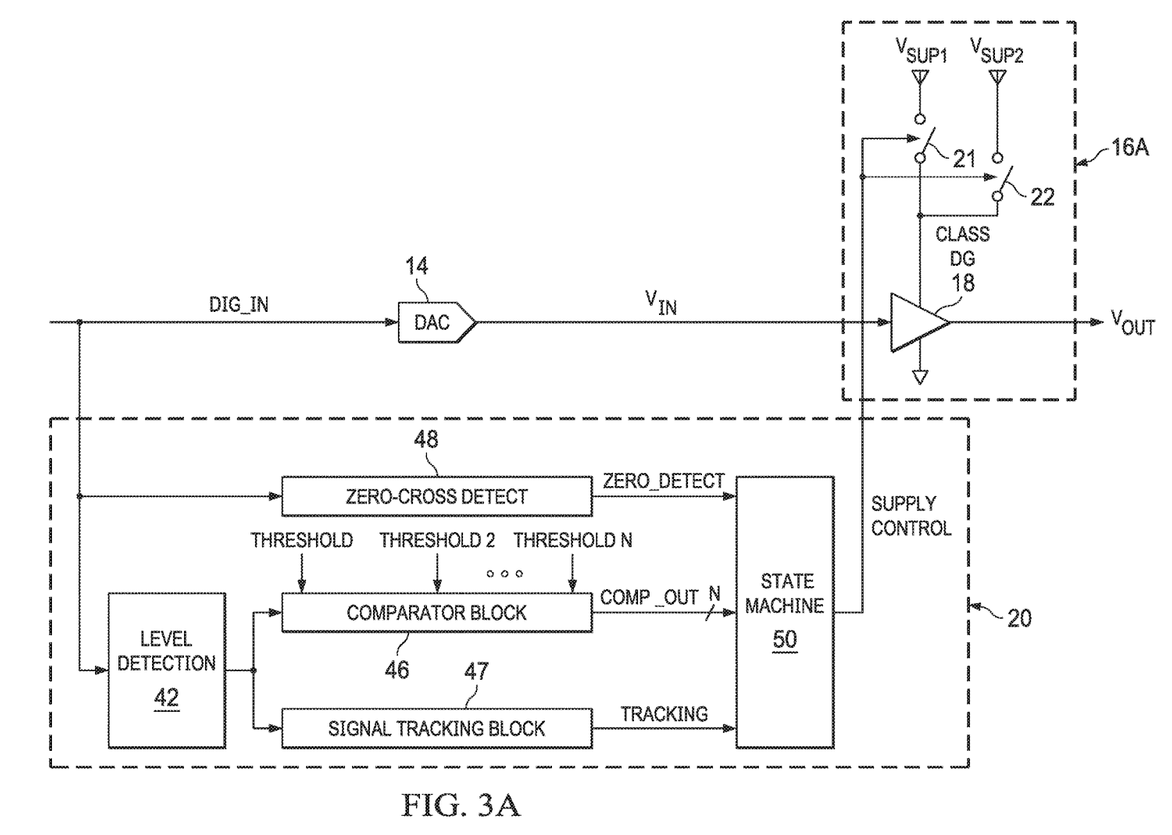
FIG. 3A is a block diagram of selected components of a control circuit for use within the audio integrated circuit depicted in FIG. 2, and selected components of an audio integrated circuit which may be coupled to the control circuit, in accordance with embodiments of the present disclosure.

FIG. 3A is a block diagram of selected components of an example control circuit 20 for use within audio IC 9, and selected components of audio IC 9 which may be coupled to control circuit 20, in accordance with embodiments of the present disclosure. As shown in FIG. 3A, amplifier stage 16 of FIG. 2 may be implemented with an amplifier stage 16A having a Class DG amplifier 18 which has an input for receiving analog signal $V_{IN}$, an output for generating an output signal $V_{OUT}$ based on and indicative of analog signal $V_{IN}$, and a power supply input for receiving one of at least two power supply voltages (e.g., $V_{SUP1}$, $V_{SUP2}$) based on one or more control signals SUPPLY CONTROL for selectively activating (e.g., enabling, closing, turning on) and deactivating (e.g., disabling, opening, turning off) switches 21 and 22, wherein each of switches 21 and 22 couples the power supply input to a respective supply voltage (e.g., $V_{SUP1}$, $V_{SUP2}$). For purposes of clarity and exposition, FIG. 3A depicts amplifier stage 16A as having only two selectable power supply voltages. However, in some embodiments, amplifier stage 16A may have three or more selectable power supply voltages.

Also as shown in FIG. 3A, control circuit 20 may include a level detection circuit 42, a comparator block 46, a signal tracking block 47, a zero-cross detection circuit 48, and a state machine 50. Level detection circuit 42 may include any suitable system, device, or apparatus for receiving digital audio input signal DIG_IN (or a derivative thereof), determining a magnitude of such signal, and outputting a signal indicative of such magnitude. Comparator block 46 may compare the output signal of level detection circuit 42 with N predetermined threshold magnitudes, wherein N is a positive integer, and based on such comparison, output a signal COMP_OUT (which may comprise N bits) indicative of whether the desired magnitude of audio output signal $V_{OUT}$ is greater or lesser than each of such predetermined threshold magnitudes. In some embodiments, such predetermined threshold magnitudes may be relative to a full-scale voltage of digital audio input signal DIG_IN and/or audio output signal $V_{OUT}$. In some embodiments, comparator block 46 may implement hysteresis, such that signal COMP_OUT or a bit thereof may only transition if the output signal of level detection block 42 remains above or below a predetermined threshold magnitude for a minimum duration of time (e.g., 0.1 seconds to place any switching artifacts outside the human-perceptible audio range).

Zero-cross detection circuit 48 may include any suitable system, device, or apparatus for detecting the occurrence of a zero crossing of a digital audio input signal (or a derivative thereof) and outputting a signal ZERO_DETECT indicating that a zero crossing of such signal has occurred. A zero crossing of a signal may occur when the waveform of such signal crosses a magnitude of zero or crosses another level within a threshold of zero and indicative of a zero crossing (e.g., a low signal level of lower than −70 dB or within a small number of least significant bits of zero).

Signal tracking block 47 may comprise any suitable system, device, or apparatus for tracking a particular parameter of an audio signal, including without limitation a plurality of peaks of such audio signal and/or a signal envelope of such audio signal, and based thereon, generate an output signal TRACKING indicative of such tracked parameter.

State machine 50 may receive signals COMP_OUT, TRACKING, and/or ZERO_DETECT, and based on one or more of such signals, generate one or more signals SUPPLY CONTROL for controlling a power supply voltage of amplifier stage 16A, as described in greater detail elsewhere in this disclosure.

For example, when the magnitude of digital audio input signal DIG_IN transitions from above to below a predetermined threshold magnitude (e.g., −24 dB), signal COMP_OUT may indicate such transition and in response, state machine 50 may wait until the occurrence of a zero crossing (as indicated by signal ZERO_DETECT), after which (assuming $V_{SUP2} > V_{SUP1}$) state machine 50 may cause switch 22 to deactivate and switch 21 to activate, thus changing the power supply voltage received by Class DG amplifier 18 from power supply voltage $V_{SUP2}$ to power supply voltage $V_{SUP1}$. Such decrease in power supply voltage for lower signal magnitudes may increase the power efficiency of audio IC 9. Furthermore, by changing the power supply voltage at a zero crossing of digital audio input signal DIG_IN (or a derivative thereof), the change and any auditory artifacts associated with the change may be masked and therefore be unnoticeable or less noticeable to a listener of an audio device including audio IC 9.

As another example, when the sum of the magnitude of digital audio input signal DIG_IN transitions from below to above a predetermined threshold magnitude (e.g., −24 dB), signal COMP_OUT may indicate such transition, and in response, state machine 50 may cause switch 21 to deactivate and switch 22 to activate, thus changing the power supply voltage received by Class DG amplifier 18 from power supply voltage $V_{SUP1}$ to power supply voltage $V_{SUP2}$. However, when changing from a lower power supply voltage to a higher power supply voltage, it may not be desirable to wait for a zero cross of the output signal, as a transition from below to above the predetermined threshold magnitude may almost immediately lead to clipping of the audio signal. Accordingly, it may be desirable to predict whether the magnitude of digital audio input signal DIG_IN is likely to cross such predetermined threshold and switch the power supply voltage responsive to such prediction at a zero crossing event of the digital audio input signal DIG_IN occurring before the actual crossing of the predetermined threshold by the digital audio input signal DIG_IN. By applying such predictive techniques, examples of which are explained below and illustrated by FIGS. 4-7, control circuit 20 may facilitate changing between power supply voltages associated with amplifier stage 16A to increase power efficiency while reducing audio artifacts.

Figure 3B:
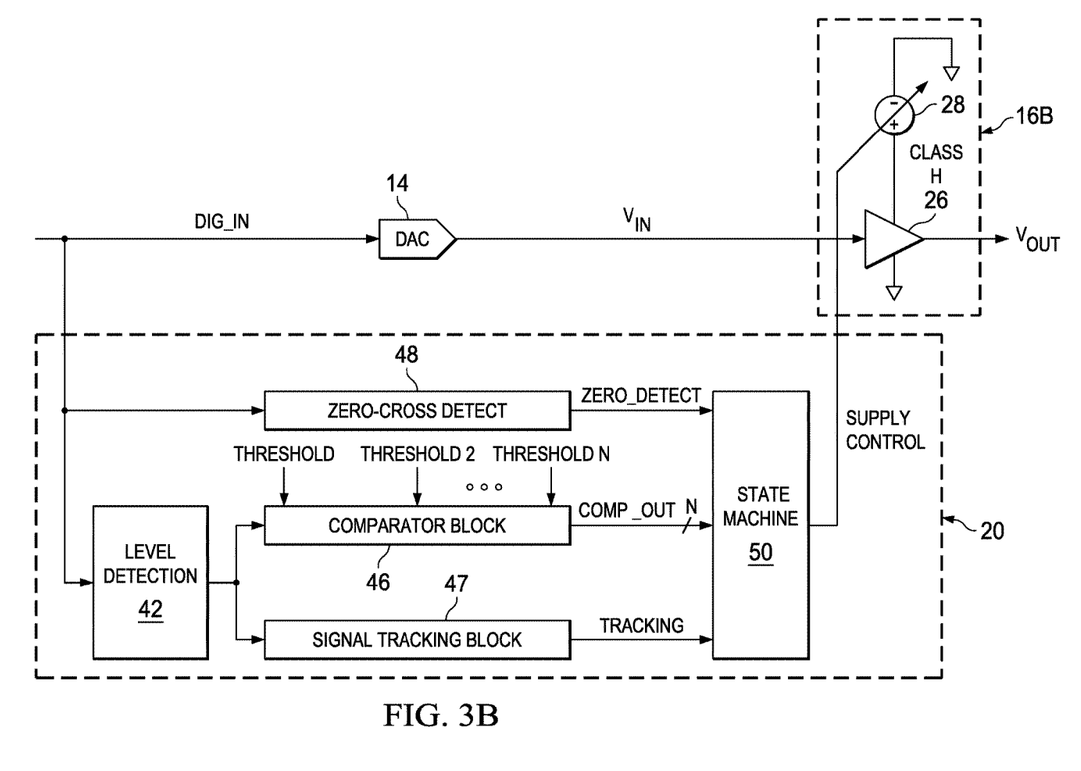
FIG. 3B is another block diagram of selected components of a control circuit for use within the audio integrated circuit depicted in FIG. 2, and selected components of an audio integrated circuit which may be coupled to the control circuit, in accordance with embodiments of the present disclosure.

FIG. 3B is a block diagram of selected components of an example control circuit 20 for use within audio IC 9, and selected components of audio IC 9 which may be coupled to control circuit 20, in accordance with embodiments of the present disclosure. As shown in FIG. 3B, amplifier stage 16 of FIG. 2 may be implemented with an amplifier stage 16B having a Class H amplifier 26 which has an input for receiving analog signal $V_{IN}$, an output for generating an output signal $V_{OUT}$ based on and indicative of analog signal $V_{IN}$, and a power supply input for receiving the supply voltage output by a variable power supply 28, wherein variable voltage supply 28 outputs a variable supply voltage based on one or more control signals SUPPLY CONTROL. Supply voltages output by variable power supply 28 may be selected from a plurality of discrete voltages, or may include an infinite number of voltages between a minimum and maximum voltage. Other than the signal SUPPLY CONTROL being used to modulate an output voltage of variable power supply 28 (as opposed to controlling switches 21 and 22 in amplifier stage 16A of FIG. 3A), control circuit 20 of FIG. 3B may be similar in all material respects to control circuit 20 of FIG. 3A.

Similar to FIG. 3A, when the magnitude of digital audio input signal DIG_IN transitions from above to below a predetermined threshold magnitude (e.g., −24 dB), signal COMP_OUT may indicate such transition and in response, state machine 50 may wait until the occurrence of a zero crossing (as indicated by signal ZERO_DETECT), after which state machine 50 may cause variable voltage supply 28 to decrease the supply voltage provided to Class H amplifier 26. Such decrease in power supply voltage for lower signal magnitudes may increase the power efficiency of audio IC 9. Furthermore, by changing the power supply voltage at a zero crossing of digital audio input signal DIG_IN (or a derivative thereof), the change and any auditory artifacts associated with the change may be masked and therefore be unnoticeable or less noticeable to a listener of an audio device including audio IC 9.

Similarly, when the sum of the magnitude of digital audio input signal DIG_IN transitions from below to above a predetermined threshold magnitude (e.g., −24 dB), signal COMP_OUT may indicate such transition, and in response, state machine 50 may cause variable voltage supply 28 to increase the supply voltage provided to Class H amplifier 26. However, when changing from a lower power supply voltage to a higher power supply voltage, it may not be desirable to wait for a zero cross of the output signal, as a transition from below to above the predetermined threshold magnitude may almost immediately lead to clipping of the audio signal. Accordingly, it may be desirable to predict whether the magnitude of digital audio input signal DIG_IN is likely to cross such predetermined threshold and switch the power supply voltage responsive to such prediction at a zero crossing event of the digital audio input signal DIG_IN occurring before the actual crossing of the predetermined threshold by the digital audio input signal DIG_IN. By applying such predictive techniques, examples of which are explained below and illustrated by FIGS. 4-7, control circuit 20 may facilitate changing between power supply voltages associated with amplifier stage 16B to increase power efficiency while reducing audio artifacts.

FIGS. 4 through 7 illustrate example waveforms demonstrating predictive methodologies that may be performed by control circuit 20. In each of FIGS. 4 through 7, the y-axis represents a voltage of digital audio input signal DIG_IN given in decibels relative to a full-scale voltage of digital audio input signal DIG_IN.

Figure 4:
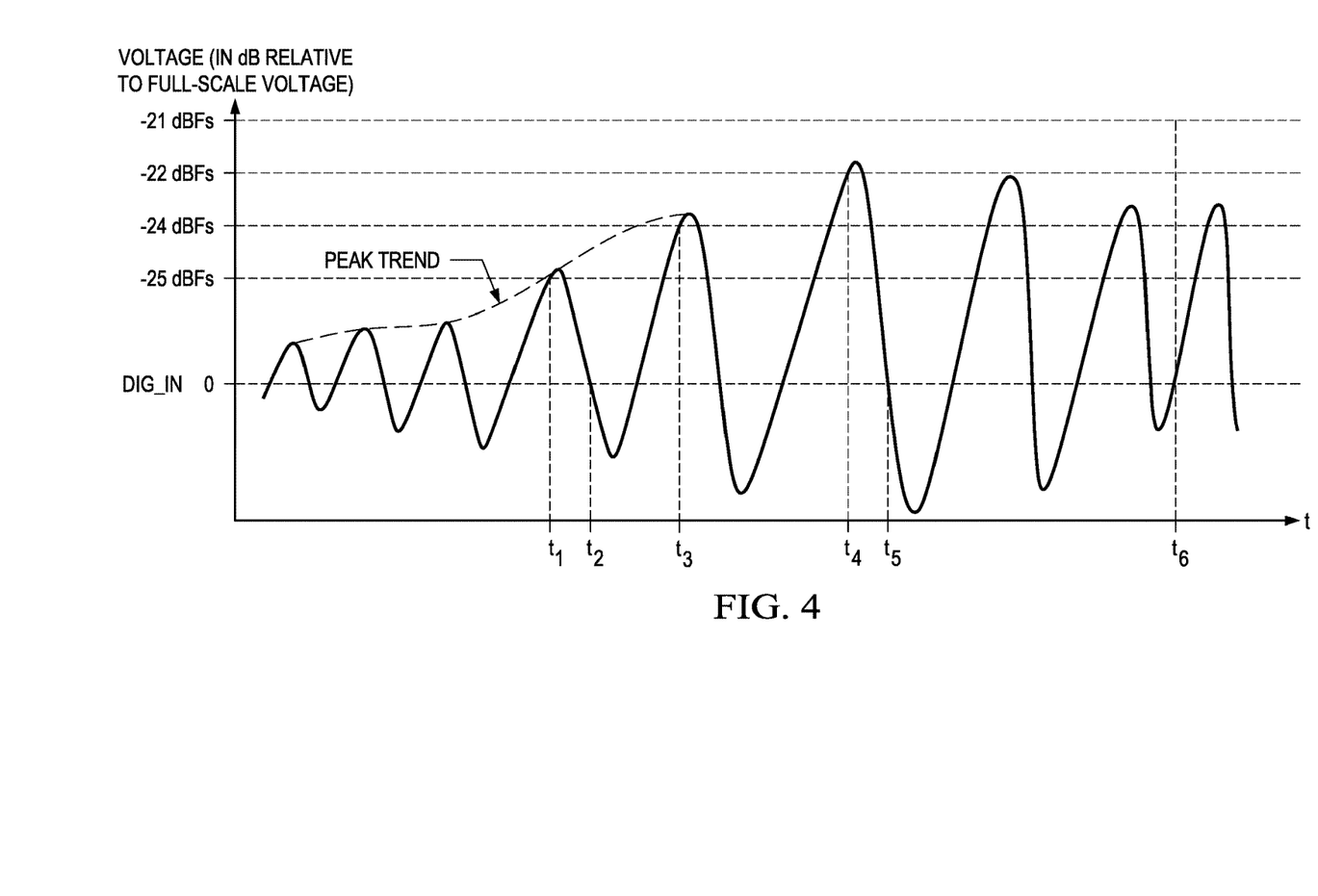
FIGS. 4 through 7 illustrate example waveforms demonstrating predictive methodologies performed by the control circuit depicted in FIGS. 3A and 3B.

As depicted in the example waveform graph for digital audio input signal DIG_IN versus time shown in FIG. 4, control circuit 20 may predict whether the magnitude of digital audio input signal DIG_IN is likely to cross a predetermined primary threshold by determining whether digital audio input signal DIG_IN (or a derivative thereof) crosses a secondary threshold. To illustrate, to predict whether digital audio input signal DIG_IN will increase above a primary threshold for changing a power supply voltage associated with amplifier stage 16 (e.g., −24 dB relative to full-scale voltage of digital audio input signal DIG_IN), control circuit 20 may monitor (e.g., with comparator block 46) whether digital audio input signal DIG_IN increases above a secondary threshold (e.g., −25 dB relative to full-scale voltage of digital audio input signal DIG_IN) lower than the primary threshold, which occurs at time $t_1$ shown in FIG. 4. Responsive to digital audio input signal DIG_IN increasing above such secondary threshold, control circuit 20 may wait for the next zero-crossing event of digital audio input signal DIG_IN (e.g., as detected by zero-cross detection circuit 48) which occurs at time $t_2$ shown in FIG. 4. At such zero-cross event, control circuit 20 may cause the power supply voltage associated with amplifier stage 16 to increase. When digital audio input signal DIG_IN subsequently increases above the primary threshold (e.g., above −24 dB), which occurs at time $t_3$ shown in FIG. 4, no changes in power supply voltage associated with amplifier stage 16 may occur, as such change already occurred at the previous zero-crossing event.

In some embodiments, state machine 50 may also implement a timing element (e.g., a timer or counter) in connection with a secondary threshold to determine whether digital audio input signal DIG_IN will increase above a primary threshold. To illustrate, to predict whether digital audio input signal DIG_IN will increase above a primary threshold (e.g., −21 dB relative to full-scale voltage of digital audio input signal DIG_IN) for changing a power supply voltage associated with amplifier stage 16, control circuit 20 may monitor (e.g., with comparator block 46) whether digital audio input signal DIG_IN increases above a secondary threshold (e.g., −22 dB relative to full-scale voltage of digital audio input signal DIG_IN) lower than the primary threshold, which occurs at time $t_4$ shown in FIG. 4. Responsive to digital audio input signal DIG_IN increasing above such secondary threshold, control circuit 20 may wait for the next zero-crossing event of digital audio input signal DIG_IN (e.g., as detected by zero-cross detection circuit 48) which occurs at time $t_5$ shown in FIG. 4. At such zero-cross event, control circuit 20 may cause the power supply voltage associated with amplifier stage 16 to increase. In addition, responsive to digital audio input signal DIG_IN increasing above such secondary threshold at time $t_4$, state machine 50 may initiate a timing element to time a duration beginning at the time $t_4$ in which the digital audio input signal DIG_IN increases above such secondary threshold. If, prior to the duration of time expiring, digital audio input signal DIG_IN increases above the primary threshold, control circuit 20 may maintain the power supply voltage associated with amplifier stage 16 at the level to which it was switched at the zero-crossing event at time $t_5$. Otherwise, if the duration of time expires, shown as time $t_6$ in FIG. 4, prior to digital audio input signal DIG_IN increasing above the primary threshold, control circuit 20 may predict that an increase above the primary threshold may not occur, and may switch the power supply voltage associated with amplifier stage 16 to the level which it had prior to the zero-crossing event at time $t_5$.

In these and other embodiments, control circuit 20 may employ signal tracking techniques to predict whether digital audio input signal DIG_IN may increase above a secondary threshold. For example, control circuit 20 (e.g., via signal tracking block 47) may track a peak trend of the magnitude peaks of digital audio input signal DIG_IN as shown in FIG. 4. From tracking the magnitude peaks, control circuit 20 may extrapolate the trend to determine if the magnitude of digital audio input signal DIG_IN is trending towards increasing above a primary threshold (e.g., −24 dB relative to full-scale voltage of digital audio input signal DIG_IN). Additionally or alternatively tracking peak trends, control circuit 20 (e.g., via signal tracking block 47) may similarly track a signal envelope of digital audio input signal DIG_IN to determine whether digital audio input signal DIG_IN is trending towards increasing above a primary threshold.

Although FIG. 4 and the foregoing description thereof has depicted use of predictive approaches for determining whether digital audio output signal DIG_IN is likely to increase from below to above a primary threshold, similar approaches (e.g., secondary thresholds, timing elements, peak tracking, signal envelope tracking, etc.) may also be used to determine whether digital audio input signal DIG_IN is likely to decrease from above to below a primary threshold and switch between power supply voltages associated with an amplifier stage in response to such predictions.

Figure 5:
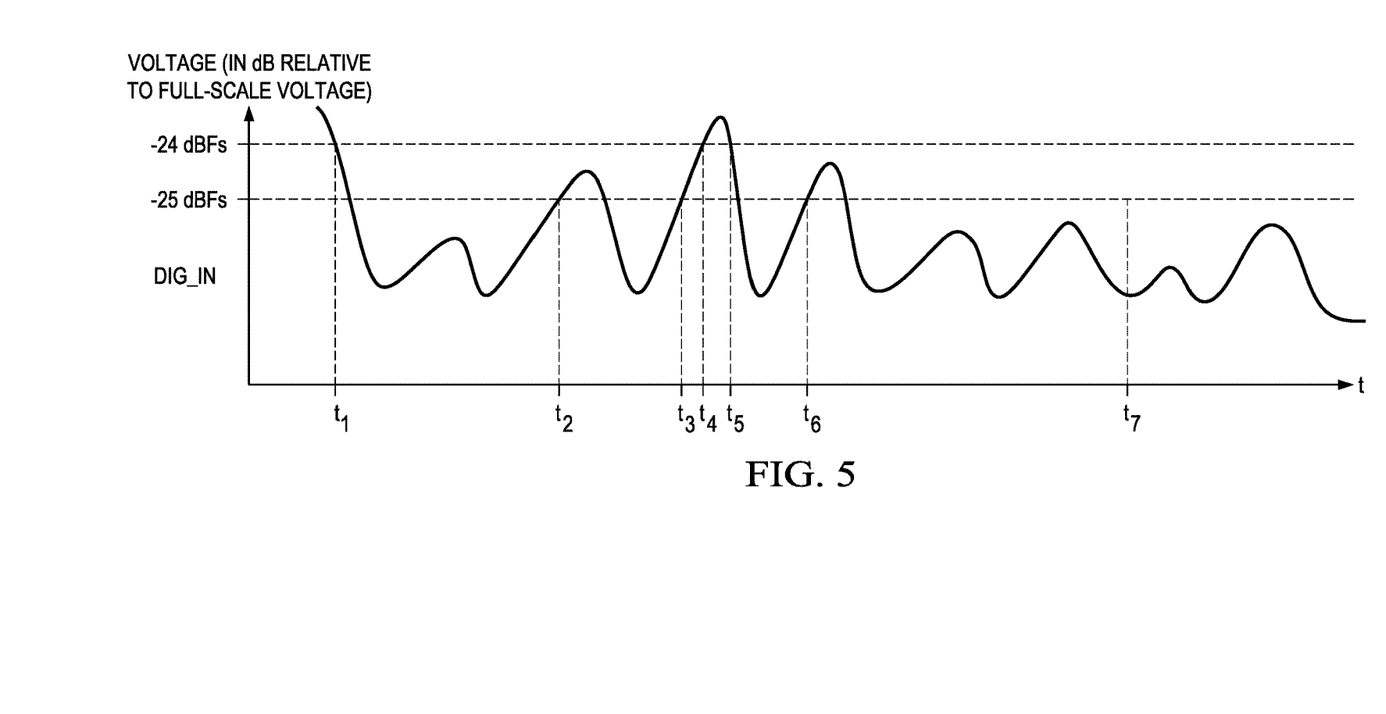

In addition or alternatively to the embodiments discussed above, control circuit 20 may employ a secondary threshold and a timing element to predict whether magnitude of digital audio input signal DIG_IN is to decrease below a predetermined primary threshold and remain below such primary threshold, as illustrated in FIG. 5. In the embodiments represented by FIG. 5, state machine 50 may initiate a timing element for a predetermined duration whenever the magnitude of digital audio input signal DIG_IN decreases from above to below a primary threshold (e.g., −24 dB relative to full-scale voltage of digital audio input signal DIG_IN) shown as times $t_1$ and $t_4$ in FIG. 5. If prior to the duration of time expiring, digital audio input signal DIG_IN increases above a secondary threshold (e.g., −25 dB relative to full-scale voltage of digital audio input signal DIG_IN) lesser than the primary threshold shown as times $t_2$, $t_3$, and $t_6$ in FIG. 5, the timing element may reset the predetermined duration of time. Upon expiration of the duration of time, shown as occurring at time $t_7$ in FIG. 5, thus indicating that digital audio input signal DIG_IN has not increased above the secondary threshold for longer than the duration of time, and provided that digital audio input signal DIG_IN is below the primary threshold, control circuit 20 may thus predict that digital audio input signal DIG_IN is and will remain below the primary threshold, and accordingly cause the power supply voltage associated with amplifier stage 16 to decrease. By using this predictive methodology, control circuit 20 may avoid switching events if the magnitude of digital audio input signal DIG_IN falls below the primary threshold but then in a short amount of time rises above the primary threshold again for a brief period of time. For example, in the graph depicted in FIG. 5, this predictive methodology prevents power supply voltage switching events from occurring at times $t_4$ and $t_5$.

Figure 6:
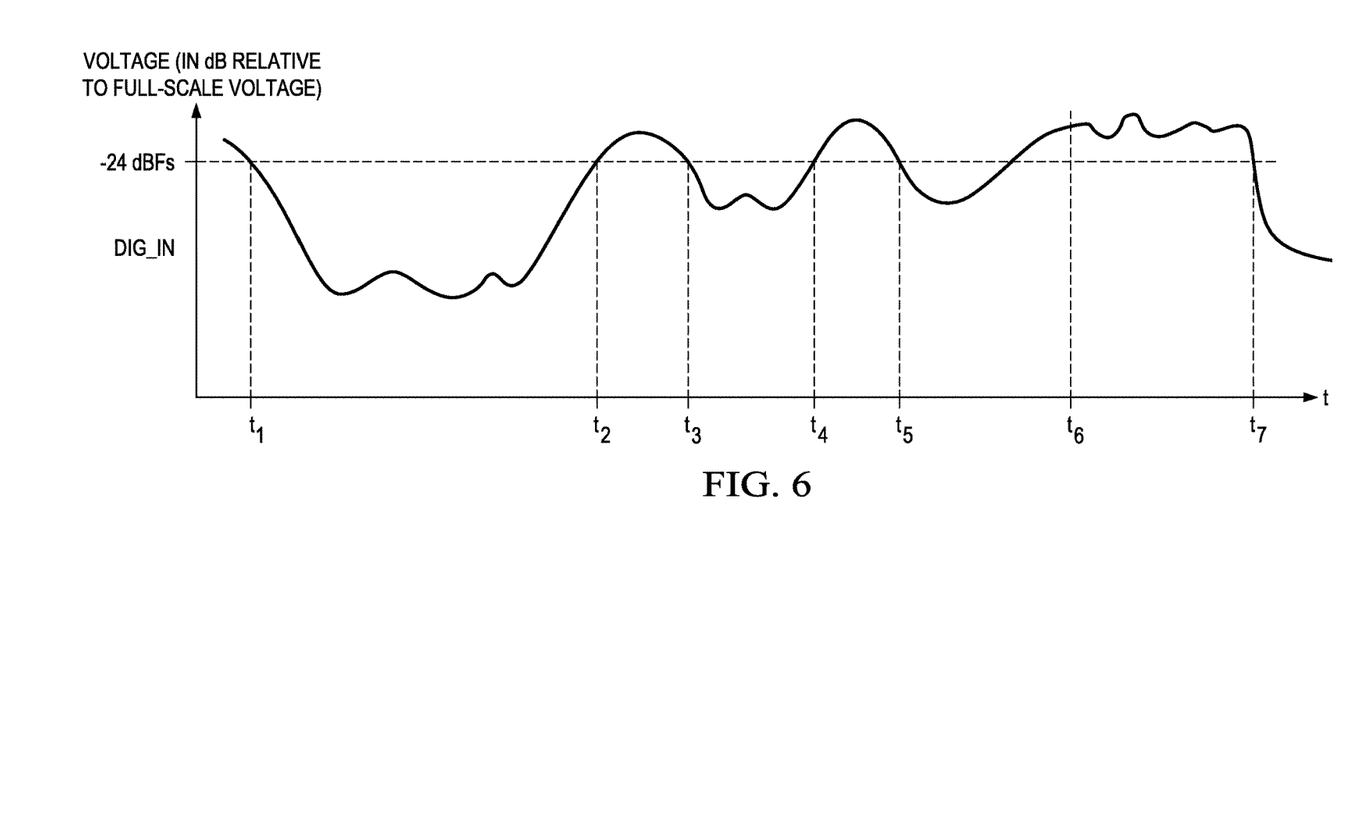

In addition or alternatively to the embodiments discussed above, control circuit 20 may employ one or more timing elements to disable changing between power supply voltages associated with amplifier stage 16 when the magnitude of digital audio input signal DIG_IN hovers near a primary threshold, as illustrated in FIG. 6. In the embodiments represented by FIG. 6, upon the magnitude of digital audio input signal DIG_IN crossing a primary threshold (e.g., −24 dB relative to full-scale voltage of digital audio input signal DIG_IN), shown as times $t_1$, $t_2$, $t_3$, $t_4$, $t_5$, $t_6$, and $t_7$ in FIG. 6, state machine 50 may initiate a timing element for a predetermined duration. If prior to the predetermined duration of time expiring, digital audio input signal DIG_IN again crosses the primary threshold (e.g., the difference between times $t_2$ and each of times $t_3$, $t_4$, and/or $t_5$ may be less than the predetermined duration of time), control circuit 20 may disable changing the power supply voltage associated with amplifier stage 16 (e.g., switching would not occur at times $t_3$, $t_4$, and $t_5$). Upon expiration of the predetermined duration of time, shown as occurring at time $t_6$ in FIG. 6 (e.g., the difference between time $t_5$ and time $t_6$ may be more than the predetermined duration of time), thus indicating that digital audio input signal DIG_IN has not crossed the primary threshold for longer than the predetermined duration of time, control circuit 20 may thus predict that digital audio input signal DIG_IN has not crossed the primary threshold for a period of time and may re-enable changing the power supply voltage associated with amplifier stage 16 when digital audio input signal DIG_IN again crosses the primary threshold, shown as time $t_7$ in FIG. 6. By using this predictive methodology, control circuit 20 may avoid multiple switching events if the magnitude of digital audio input signal DIG_IN hovers near the primary threshold.

Figure 7:
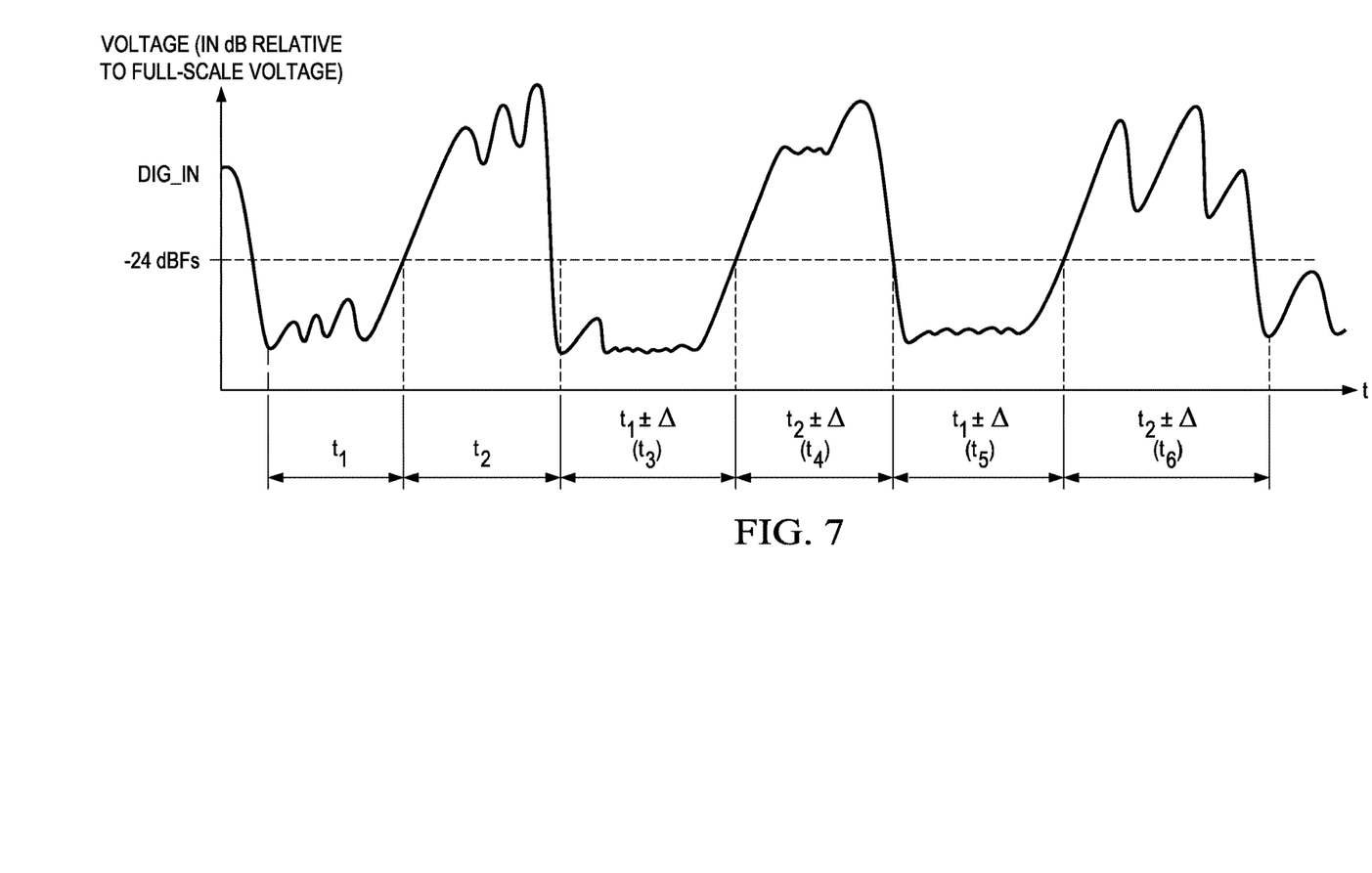

In addition or alternatively to the embodiments discussed above, control circuit 20 may be configured to predict when digital audio input signal DIG_IN has a persistent pattern of magnitude relative to a primary threshold, as illustrated in FIG. 7. To predict a persistent pattern, state machine 50 may record a period of time $t_1$ in which digital audio input signal DIG_IN remains below a primary threshold (e.g., −24 dB relative to full-scale voltage of digital audio input signal DIG_IN) and record a period of time $t_2$ in which digital audio input signal DIG_IN remains above the primary threshold. For one or more subsequent periods (e.g., time periods $t_3$, $t_5$) in which digital audio input signal DIG_IN is below the primary threshold, state machine 50 may determine a duration of such periods and compare them to the duration of the recorded period of time $t_1$. If the one or more subsequent periods are within a certain duration of time $\Delta$ of the recorded period of time $t_1$ (e.g., $t_1-\Delta \leq t_3 \leq t_1+\Delta$), control circuit 20 may determine that digital audio input signal DIG_IN has a persistent pattern. Similarly, for one or more subsequent periods (e.g., time periods $t_4$, $t_6$) in which digital audio input signal DIG_IN is above the primary threshold, state machine 50 may determine a duration of such periods and compare them to the duration of the recorded period of time $t_2$. If the one or more subsequent periods are within a certain duration of time $\Delta$ of the recorded period of time $t_1$ (e.g., $t_2-\Delta \leq t_4 \leq t_2+\Delta$), control circuit 20 may determine that digital audio input signal DIG_IN has a persistent pattern. In some embodiments, responsive to determining that a persistent pattern exists, control circuit 20 may disable changing the power supply voltage associated with amplifier stage 16. In other embodiments, when a persistent pattern exists, control circuit 20 may use information regarding the persistent pattern (e.g., time periods $t_1$ and/or $t_2$) to predict occurrence of a future crossing of the primary threshold by digital audio input signal DIG_IN, and cause a change in the power supply voltage associated with amplifier stage 16 at a zero-crossing event occurring immediately before the future crossing of the primary threshold.

In addition or alternatively to the embodiments discussed above, control circuit 20 may be configured to predict when digital audio input signal DIG_IN crosses a primary threshold by receiving digital audio input signal DIG_IN and processing such signal before the signal propagates to amplifier stage 16, such that control circuit 20 may determine and apply the desired power supply voltage associated with amplifier stage 16 before the signal propagates to amplifier stage 16.

Using the methods and systems herein disclosed, changes in a power supply voltage of an amplifier and audio artifacts associated therewith may be masked by predicting a power supply voltage threshold-crossing and in response to such prediction, pre-emptively switching ahead of such threshold-crossing at a zero-crossing of an audio signal. In the case of quickly-rising signals that cross a threshold for switching between the power supply voltage, such prediction and preemptive switching at a zero-crossing may not be necessary to avoid audio artifacts, as a quickly-rising transient nature of a signal may mask audio artifacts. However, in the case of a slower-rising signal that crosses a power supply voltage threshold-crossing, the transient effects may not mask audio artifacts, and thus the methods and systems disclosed herein for predicting a power supply voltage threshold-crossing and in response to such prediction may be employed to mask such artifacts.

Although the foregoing description may contemplate that a threshold magnitude for switching a power supply voltage in response to a signal of increasing magnitude may be the same threshold magnitude for switching the power supply voltage in response to a signal of decreasing magnitude, it is understood that in some embodiments, a threshold magnitude for switching a power supply voltage in response to a signal of increasing magnitude may be a different threshold magnitude for switching a power supply voltage in response to a signal of decreasing magnitude.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An audio amplifier circuit for providing an output signal to an audio transducer, the audio amplifier circuit comprising:
   a power amplifier having an audio input for receiving an audio input signal, an audio output for providing the output signal, and a power supply input for receiving a power supply voltage, wherein the power amplifier generates the output signal based on the audio input signal and wherein the power supply voltage is variable among at least a first supply voltage and a second supply voltage greater than the first supply voltage;
   a control circuit configured to:
      predict, based on one or more characteristics of a signal indicative of the output signal, an occurrence of a condition for changing the power supply voltage; and
      responsive to predicting the occurrence of the condition, change, at an approximate zero crossing of the signal indicative of the output signal, the power supply voltage.

2. The audio amplifier circuit of claim 1, wherein the condition for changing the power supply voltage comprises the magnitude of the signal indicative of the output signal crossing a predetermined threshold magnitude.

3. The audio amplifier circuit of claim 2, wherein the control circuit is configured to predict the condition of the signal indicative of the output signal crossing the predetermined threshold magnitude responsive to the magnitude of the signal indicative of the output signal increasing above a second predetermined threshold magnitude less than the predetermined threshold magnitude.

4. The audio amplifier circuit of claim 2, wherein the control circuit is configured to predict the condition of the signal indicative of the output signal crossing the predetermined threshold magnitude responsive to the magnitude of the signal indicative of the output signal decreasing below a second predetermined threshold magnitude greater than the predetermined threshold magnitude.

5. The audio amplifier circuit of claim 2, wherein the control circuit is configured to predict the condition of the signal indicative of the output signal crossing the predetermined threshold magnitude by:
   tracking signal peaks of the signal indicative of the output signal;

extrapolating from the signal peaks a future value of the magnitude of the signal indicative of the output signal; and predicting that the magnitude of the signal indicative of the output signal will cross the predetermined threshold magnitude based on the future value.

6. The audio amplifier circuit of claim 2, wherein the control circuit is configured to predict the condition of the signal indicative of the output signal crossing the predetermined threshold magnitude by:

tracking a signal envelope of the signal indicative of the output signal;

extrapolating from the envelope a future value of the magnitude of the signal indicative of the output signal; and predicting that the magnitude of the signal indicative of the output signal will cross the predetermined threshold magnitude based on the future value.

7. The audio amplifier circuit of claim 2, wherein the condition for changing the power supply voltage comprises the magnitude of the signal indicative of the output signal lacking a persistent pattern of magnitude relative to the predetermined threshold magnitude.

8. The audio amplifier circuit of claim 7, wherein the control circuit is further configured to detect the persistent pattern.

9. The audio amplifier circuit of claim 1, wherein the control circuit is further configured to:

predict, based on a magnitude of a signal indicative of the output signal, an occurrence of a second condition for changing the power supply voltage; and responsive to predicting the occurrence of the second condition, change, at an approximate zero crossing of the signal indicative of the output signal, the power supply voltage to be equal to a third supply voltage.

10. The audio amplifier circuit of claim 9, wherein:

the condition for changing the power supply voltage comprises the magnitude of the signal indicative of the output signal increasing from below a predetermined threshold magnitude to above the predetermined threshold magnitude; and the second condition for changing the power supply voltage comprises the magnitude of the signal indicative of the output signal increasing from below a second predetermined threshold magnitude to above the second predetermined threshold magnitude, wherein the second predetermined threshold magnitude is greater than the predetermined threshold magnitude.

11. The audio amplifier circuit of claim 10, wherein the control circuit is further configured to:

predict, based on a magnitude of a signal indicative of the output signal, an occurrence of a third condition for changing the power supply voltage, wherein the third condition for changing the power supply voltage comprises the magnitude of the signal indicative of the output signal decreasing from above the predetermined threshold magnitude to below the predetermined threshold magnitude; and responsive to predicting the occurrence of the third condition, change, at an approximate zero crossing of the signal indicative of the output signal occurs, the power supply voltage to the first supply voltage.

12. The audio amplifier circuit of claim 11, wherein the control circuit is further configured to:

predict, based on a magnitude of a signal indicative of the output signal, an occurrence of a fourth condition for changing the power supply voltage, wherein the fourth condition for changing the power supply voltage comprises the magnitude of the signal indicative of the output signal decreasing from above the second predetermined threshold magnitude to below the second predetermined threshold magnitude; and responsive to predicting the occurrence of the fourth condition, change, at an approximate zero crossing of the signal indicative of the output signal occurs, the power supply voltage to the second supply voltage.

13. The audio amplifier circuit of claim 1, wherein the condition for changing the power supply voltage comprises the magnitude of the signal indicative of the output signal refraining from crossing a predetermined threshold magnitude for a period of time.

14. The audio amplifier circuit of claim 13, wherein the control circuit is further configured to:

initialize a timer of a predetermined duration responsive to the magnitude of the signal indicative of the output signal decreasing from above the predetermined threshold magnitude to below the predetermined threshold magnitude;

responsive to the magnitude of the signal indicative of the output signal increasing from below a second predetermined threshold magnitude lesser than the predetermined threshold magnitude to above the second predetermined threshold magnitude before expiration of the timer, reinitialize the timer for the predetermined duration; and responsive to the expiration of the timer, change the power supply voltage at an approximate zero crossing of the signal indicative of the output signal occurs.

15. The audio amplifier circuit of claim 13, wherein the control circuit is further configured to:

initialize a timer of a predetermined duration responsive to the magnitude of the signal indicative of the output signal decreasing from above the predetermined threshold magnitude to below the predetermined threshold magnitude; and responsive to the expiration of the timer prior to the signal indicative of the output signal increasing from below the predetermined threshold magnitude to above the predetermined threshold magnitude, change the power supply voltage at an approximate zero crossing of the signal indicative of the output signal occurs.

16. The audio amplifier circuit of claim 13, wherein the control circuit is further configured to:

initialize a timer of a predetermined duration responsive to the magnitude of the signal indicative of the output signal crossing the predetermined threshold magnitude; and responsive to the expiration of the timer prior to the signal indicative of the output signal again crossing the predetermined threshold magnitude, change the power supply voltage at an approximate zero crossing of the signal indicative of the output signal occurs.

17. A method comprising:

in an audio amplifier circuit including a power amplifier having an audio input for receiving an audio input signal, an audio output for generating the output signal based on the audio input signal, and a power supply input for receiving a power supply voltage wherein the power supply voltage is variable among at least a first supply voltage and a second supply voltage greater than the first supply voltage:

predicting, based on one or more characteristics of a signal indicative of the output signal, an occurrence of a condition for changing the power supply voltage; and responsive to predicting the occurrence of the condition, changing, at an approximate zero crossing of the signal indicative of the output signal, the power supply voltage.

18. The method of claim 17, wherein the condition for changing the power supply voltage comprises the magnitude of the signal indicative of the output signal crossing a predetermined threshold magnitude.

19. The method of claim 18, further comprising predicting the condition of the signal indicative of the output signal crossing the predetermined threshold magnitude responsive to the magnitude of the signal indicative of the output signal increasing above a second predetermined threshold magnitude less than the predetermined threshold magnitude.

20. The method of claim 18, further comprising predicting the condition of the signal indicative of the output signal crossing the predetermined threshold magnitude responsive to the magnitude of the signal indicative of the output signal decreasing below a second predetermined threshold magnitude greater than the predetermined threshold magnitude.

21. The method of claim 18, further comprising predicting the condition of the signal indicative of the output signal crossing the predetermined threshold magnitude by:
tracking signal peaks of the signal indicative of the output signal;
extrapolating from the signal peaks a future value of the magnitude of the signal indicative of the output signal; and
predicting that the magnitude of the signal indicative of the output signal will cross the predetermined threshold magnitude based on the future value.

22. The method of claim 18, further comprising predicting the condition of the signal indicative of the output signal crossing the predetermined threshold magnitude by:
tracking a signal envelope of the signal indicative of the output signal;
extrapolating from the envelope a future value of the magnitude of the signal indicative of the output signal; and
predicting that the magnitude of the signal indicative of the output signal will cross the predetermined threshold magnitude based on the future value.

23. The method of claim 18, wherein the condition for changing the power supply voltage comprises the magnitude of the signal indicative of the output signal lacking a persistent pattern of magnitude relative to the predetermined threshold magnitude.

24. The method of claim 23, further comprising detecting the persistent pattern.

25. The method of claim 17, further comprising:
predicting, based on a magnitude of a signal indicative of the output signal, an occurrence of a second condition for changing the power supply voltage; and
responsive to predicting the occurrence of the second condition, changing, at an approximate zero crossing of the signal indicative of the output signal, the power supply voltage to be equal to a third supply voltage.

26. The method of claim 25, wherein:
the condition for changing the power supply voltage comprises the magnitude of the signal indicative of the output signal increasing from below a predetermined threshold magnitude to above the predetermined threshold magnitude; and the second condition for changing the power supply voltage comprises the magnitude of the signal indicative of the output signal increasing from below a second predetermined threshold magnitude to above the second predetermined threshold magnitude, wherein the second predetermined threshold magnitude is greater than the predetermined threshold magnitude.

27. The method of claim 26, further comprising:
predicting, based on a magnitude of a signal indicative of the output signal, an occurrence of a third condition for changing the power supply voltage, wherein the third condition for changing the power supply voltage comprises the magnitude of the signal indicative of the output signal decreasing from above the predetermined threshold magnitude to below the predetermined threshold magnitude; and
responsive to predicting the occurrence of the third condition, changing, at an approximate zero crossing of the signal indicative of the output signal occurs, the power supply voltage to the first supply voltage.

28. The method of claim 27, further comprising:
predicting, based on a magnitude of a signal indicative of the output signal, an occurrence of a fourth condition for changing the power supply voltage, wherein the fourth condition for changing the power supply voltage comprises the magnitude of the signal indicative of the output signal decreasing from above the second predetermined threshold magnitude to below the second predetermined threshold magnitude; and
responsive to predicting the occurrence of the fourth condition, changing, at an approximate zero crossing of the signal indicative of the output signal occurs, the power supply voltage to the second supply voltage.

29. The method of claim 27, wherein the condition for changing the power supply voltage comprises the magnitude of the signal indicative of the output signal refraining from crossing a predetermined threshold magnitude for a period of time.

30. The method of claim 29, further comprising:
initializing a timer of a predetermined duration responsive to the magnitude of the signal indicative of the output signal decreasing from above the predetermined threshold magnitude to below the predetermined threshold magnitude;
responsive to the magnitude of the signal indicative of the output signal increasing from below a second predetermined threshold magnitude lesser than the predetermined threshold magnitude to above the second predetermined threshold magnitude before expiration of the timer, reinitializing the timer for the predetermined duration; and
responsive to the expiration of the timer, changing the power supply voltage at an approximate zero crossing of the signal indicative of the output signal occurs.

31. The method of claim 29, further comprising:
initializing a timer of a predetermined duration responsive to the magnitude of the signal indicative of the output signal decreasing from above the predetermined threshold magnitude to below the predetermined threshold magnitude; and
responsive to the expiration of the timer prior to the signal indicative of the output signal increasing from below the predetermined threshold magnitude to above the predetermined threshold magnitude, changing the power supply voltage at an approximate zero crossing of the signal indicative of the output signal occurs.

32. The method of claim 29, further comprising:
- initializing a timer of a predetermined duration responsive to the magnitude of the signal indicative of the output signal crossing the predetermined threshold magnitude; and
- responsive to the expiration of the timer prior to the signal indicative of the output signal again crossing the predetermined threshold magnitude, changing the power supply voltage at an approximate zero crossing of the signal indicative of the output signal occurs.

* * * * *